(12) United States Patent
Narayan

(10) Patent No.: US 7,295,581 B2
(45) Date of Patent: Nov. 13, 2007

(54) EXTERNAL CAVITY TUNABLE OPTICAL TRANSMITTERS

(75) Inventor: Raghuram Narayan, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 269 days.

(21) Appl. No.: 10/673,534

(22) Filed: Sep. 29, 2003

(65) Prior Publication Data

US 2005/0068996 A1 Mar. 31, 2005

(51) Int. Cl.
  *H01S 3/10* (2006.01)
(52) U.S. Cl. .......................... 372/20; 372/92
(58) Field of Classification Search ................ 372/101, 372/20, 92
  See application file for complete search history.

(56) References Cited

U.S. PATENT DOCUMENTS

| | | | |
|---|---|---|---|
| 5,044,718 A * | 9/1991 | Kando | 385/4 |
| 5,081,630 A | 1/1992 | Lowenthal et al. | |
| 5,181,214 A | 1/1993 | Berger et al. | |
| 5,267,252 A | 11/1993 | Amano | |
| 5,442,651 A | 8/1995 | Maeda | |
| 5,446,750 A | 8/1995 | Ohtsuka et al. | |
| 5,781,003 A * | 7/1998 | Kondo | 324/96 |
| 5,862,162 A | 1/1999 | Maeda | |
| 6,018,535 A | 1/2000 | Maeda | |
| 6,034,761 A * | 3/2000 | Takamiya | 356/28.5 |
| 6,526,071 B1 | 2/2003 | Zorabedian et al. | |
| 6,665,321 B1 | 12/2003 | Sochava et al. | |
| 6,700,904 B2 | 3/2004 | Asami | |
| 6,724,790 B1 | 4/2004 | Daiber et al. | |
| 6,845,121 B2 | 1/2005 | McDonald | |
| 2001/0036206 A1* | 11/2001 | Jerman et al. | 372/20 |
| 2004/0101016 A1* | 5/2004 | McDonald et al. | 372/97 |
| 2005/0135439 A1* | 6/2005 | Chapman et al. | 372/20 |

OTHER PUBLICATIONS

Timothy Day, Frank Luecke, Michael Brownell, *Continuosly Tunable Diode Lasers*, New Focus, Inc., Mountain View,California, Lasers & Optronics, Jun. 1993, 6 pages.
F.J. Duarte, *Multiple-prism granting designs tune diode lasers*, Laser Focus World, Feb. 1993, pp. 103-109.
M. de Lebachelerie, G. Passedat, *Mode-hop suppression of Littrow granting-tuned lasers*, Applied Optics vol. 32, No. 3, Jan. 20, 1993, pp. 269-274.
Michael G. Littman, *Single-Mode Operation of Grazing-Incidence Pulsed Dye Laser*, Optical Society of America, Optics Letters, vol. 3, No. 4, Oct. 1978, pp. 138-140.

(Continued)

*Primary Examiner*—Dung Nguyen
(74) *Attorney, Agent, or Firm*—Hanley, Flight & Zimmerman, LLC

(57) ABSTRACT

External cavity optical transmitters are disclosed which include a gain chip and a mirror that define an optical cavity. The optical cavity may include collimating lenses, electro-optic crystals for controlled phase shift, and additional frequency selective optical components such as a grating and/or an etalon. The external cavity laser is capable of lasing at any of the specified ITU wavelengths (frequencies) in the L, C, or any other band in the optical spectrum. The optical transmitter is wavelength tuned by a lens mounted on an actuator.

5 Claims, 6 Drawing Sheets

OTHER PUBLICATIONS

*82 nm of Continuous Tunability for an External Cavity Semiconductor Laser*, Electronics Letters, vol. 27, No. 2, Jan. 17, 1991, pp. 183-184.

Dr. Timothy Day, *External Cavity Tunable Lasers for Network Deploymen*, New Focus, Inc., San Jose, California, IEEE 2001 0-7803-7100-3/01, Mar. 2001, pp. 39-40.

Haim Lotem, *Littrow-Mounted Diffraction Granting Cavity*, Applied Optics, vol. 33, No. 6, Feb. 20, 1994, pp. 930-934.

Paul Zorabedian, *Characteristics of a Granting-External-Cavity Semiconductor Laser Containing Intracavity Prism Beam Expanders*, Jurnal of Lightware Technology, vol. 10, No. 3, Mar. 1992, pp. 330-335.

W.R. Trutna, L.F. Strokes, *Continuously Tuned External Cavity Semiconductor Laser*, Jurnal of Lightware Technology, vol. 11, No. 8, Aug. 1993, pp. 1279-1286.

* cited by examiner

EXTERNAL CAVITY TUNABLE OPTICAL TRANSMITTERS

TECHNICAL FIELD

The present disclosure pertains to optical systems and, more particularly, to external cavity tunable optical transmitters.

BACKGROUND

Optical systems are widely used in communications applications to facilitate the exchange of information such as voice and data over fiber cable, which may be fabricated from glass or any other suitable composite material. Both telephony and Internet-based systems exploit the wide bandwidth and large data capacity that optical systems provide. Additionally, as compared to conventional wired systems, optical networks are easily maintained and repaired.

Conventional optical systems include a transmitter having a laser that operates at or near one of the wavelengths specified by the International Telecommunications Union (ITU). The laser could be an external cavity laser having an optical cavity, a grating, and an etalon. In such an arrangement, the grating coarsely tunes the laser and the etalon finely tunes the laser. As will be readily appreciated by those having ordinary skill in the art, the optical length of the cavity in which a laser operates and the free spectral ranges of the grating and the etalon affect the wavelength at which the laser lases. Accordingly, as the dimensions of the laser cavity change, the operating wavelength of the laser drifts, resulting in reduced power output from the laser and potentially in mode hopping of the laser. Additionally, it is possible to fabricate lasers capable of operation at a number of different wavelengths that are spaced evenly with respect to one another. For example, etalons have free spectral ranges of 25, 50, and 100 Gigahertz (GHz), which allow lasers to be designed to operate within these frequency spacings.

To address wavelength drift and to allow for wavelength tuning of lasers, gratings of previous external cavity lasers were pivotable about their axes. The pivotable nature of the gratings allowed the grating to steer a particular wavelength of interest so that it would be reflected from the grating at an angle that would cause the optical energy to reflect into the optical cavity for lasing.

DETAILED DESCRIPTION

Although the following discloses example systems including, among other components, software executed on hardware, it should be noted that such systems are merely illustrative and should not be considered as limiting. For example, it is contemplated that any or all of these components could be implemented using dedicated hardware, exclusively in software, exclusively in firmware or in some combination of hardware, firmware and/or software. Accordingly, while the following describes example systems, persons of ordinary skill in the art will readily appreciate that the examples are not the only way to implement such systems.

Figure 1:
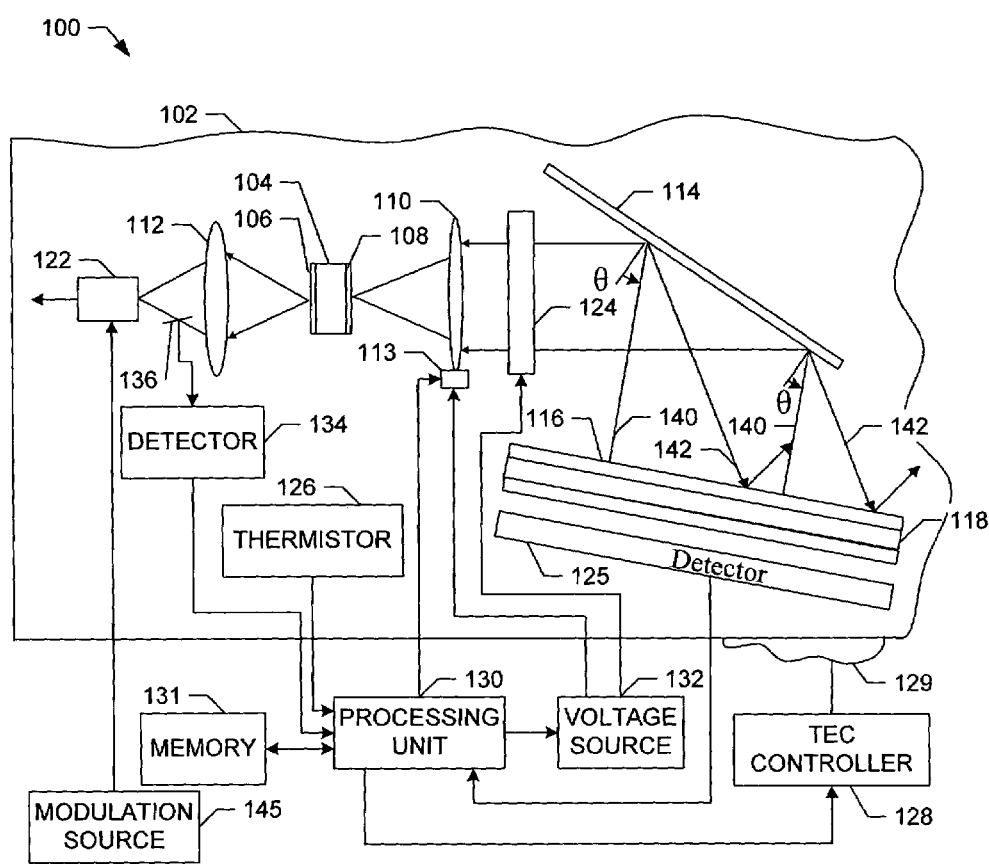
FIG. 1 is a diagram of an example optical transmitter.

Turning now to FIG. 1, an external cavity optical transmitter (optical transmitter) 100 includes a substrate 102 on which a number of components are disposed to form an external cavity laser. In particular, a gain chip 104 having first and second reflective coatings 106, 108, a first lens 110, a second lens 112, an actuator 113 on which the first lens 110 is mounted, a grating 114 and an etalon 116, which may be combined with a mirror 118 to form a resonant optical cavity. In one example, the second reflective coating 108 is an anti-reflection coating having a reflectivity less than 1 E-5. The second lens 112 is disposed between the first reflective coating 106 of gain chip 104 and a coupling 122. The coupling 122 may be an optical fiber, an optical modulator, or any other suitable optical component. The grating 114, etalon 116, mirror 118, and the first lens 110 are mounted in a manner that leaves them relatively thermally insensitive so that the temperature of the gain chip 104 may be varied without affecting the other components. In an alternate implementation, the gain chip 104 may be operated at a fixed temperature when using thermally sensitive components in the transmitter 100.

The optical transmitter 100 further includes an electro-optic crystal (EO) 124 disposed between the first lens 110 and the grating 114. In operation, as a bias voltage on the EO 124 is changed, the refractive index though the EO 124 changes, thereby changing the effective optical path length between the gain chip 104 and the mirror 118, which, in turn, enables single mode hop-free operation of the external cavity laser at the chosen wavelength.

As shown in FIG. 1, there are various electrical components associated with the optical transmitter 100. The electrical devices may include a back facet detector 125, a thermistor 126, and a thermal-electric cooler (TEC) controller 128, which is coupled to a TEC 129. The optical transmitter 100 further includes a processing unit 130 and an associated memory 131. The processing unit 130 is coupled to the actuator 113, the back facet detector 125, the thermistor 126, the TEC controller 128, and is further coupled to a voltage source 132. The voltage source 132 is coupled to the actuator 113 and the EO 124. Additionally or alternatively, the transmitter 100 may include a front facet detector 134, which receives optical energy from a beam splitter 136, and is coupled to the processing unit 130. In such an arrangement, the beam splitter 136 could be implemented using, for example, a 5% beam splitter.

The actuator 113 may be implemented using a voice coil-type actuator having a physical displacement that varies as a function of the voltage that is applied thereto. In one example, the actuator 113 may be displaceable in two dimensions and may be a dual axis voice coil. For example, the actuator 113 may have a relative position of zero when no voltage is applied thereto, but may have a relative position of one millimeter (mm) when one volt is applied thereto. Alternatively, the range of movement could be anywhere between 50 microns and 1000 microns over a one volt or sub-one volt input range. As an alternative to voice coil technology, the actuator 113 could be implemented using actuators of other types or technologies, such as, for example, piezo-electric actuators.

It should be noted that while the processing unit 130 and the memory 131 are shown as separate components in FIG. 1, those having ordinary skill in the art will readily recognize that such a representation is merely one example configuration of a processing unit and its associated memory. For example, the processing unit 130 and the memory 131 could be integrated into one single processing unit including on-board memory.

Generally, during operation, when power is applied to the gain chip 104, the gain chip 104 emits optical energy through the second reflective coating 108 and the first lens 110 transfers the emitted optical energy to the grating 114. The grating 114 separates the optical energy into its constituent wavelengths and reflects a wavelength of interest to the mirror 118 through the etalon 116. This is represented in FIG. 1 by the ray lines 140. The optical energy emitted from the gain chip 104 at the wavelength of interest is reflected from the grating at an angle θ, which is perpendicular to the surface of the mirror 118. The energy reflected at angle θ reaches the mirror 118 and is reflected back from the mirror 118 to the grating 114 and through the first lens 110 to the gain chip 104. Accordingly, the gain chip 104 and the mirror 118 form an optical resonant cavity in which lasing at the wavelength of interest occurs. In such an arrangement, the grating 114 performs coarse filtering and the etalon performs fine filtering at the ITU frequencies. Optical energy that is not at the wavelength of interest reflects from the grating 114 to the mirror 118 at an angle such that the mirror 118 will not reflect that optical energy back to the gain chip 104, but instead reflects the undesired optical energy in a different direction. The reflection of wavelengths that are not of interest is represented in FIG. 1 by the ray lines 142.

While the gain chip 104, the grating 114 and the mirror 118 form the optical resonant cavity, the gain chip 104, the second lens 112 and the coupling 122 form the output of the optical transmitter 10. In particular, during operation, optical energy from the gain chip 104, which is a result of the lasing between the first reflective coating 106 and the mirror 118, is emitted from the gain chip 104 through the first reflective coating 106 and coupled to the coupling 122 via the second lens 112. As shown in FIG. 1, the optical transmitter 100 may include a modulation source 145. The source 145 may be separate from, or a part of, the substrate 102, and provides an information signal to the coupling 122 that may cause the coupling 122 to modulate the intensity of the optical energy.

The processing unit 130 is also able to control the voltage source 132 to change the voltage bias applied to the EO 124 to alter the refractive index thereof. Accordingly, the effective optical path length, between the gain chip 104 and the mirror 118 changes with the bias voltage applied to the EO 124. Additionally, the processing unit 130 controls the actuator 113 to change the position of the first lens 110 to select a particular wavelength for lasing. Further details pertinent to the operational aspects of the optical transmitter 100 are now provided in conjunction with FIGS. 2-5.

As will be readily appreciated by those having ordinary skill in the art, various ones of the optical components (e.g., the gain chip 104, the grating 114 or the mirror 116) can change positions over time and over temperature. Positional fluctuation of the optical components alters the length of the optical cavity and the optical alignment of the system, thereby changing the lasing wavelength, output power, and modal stability of the system 100. As disclosed herein, because the first lens 110 is mounted on the actuator 113, the position of the first lens 110 may be varied to tune the lasing wavelength of the system 100. Additionally, the ability to change the physical location of the first lens 110 enables the processing unit 130, via the actuator 113, to select a particular wavelength for lasing.

Figure 2:
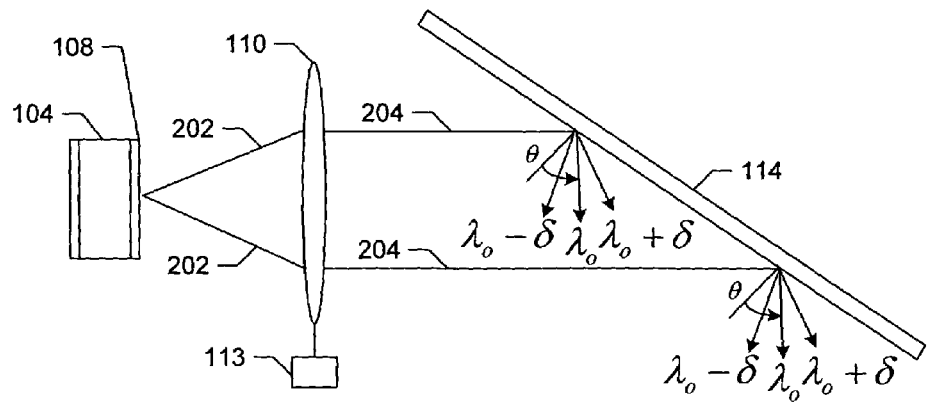
FIG. 2 is a diagram showing the lens of FIG. 1 in a first position.
Figure 3:
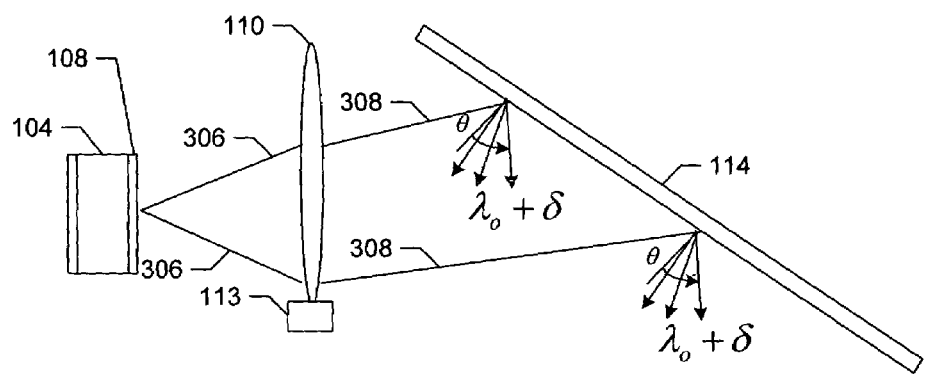
FIG. 3 is a diagram showing the lens of FIG. 1 in a second position.
Figure 4:
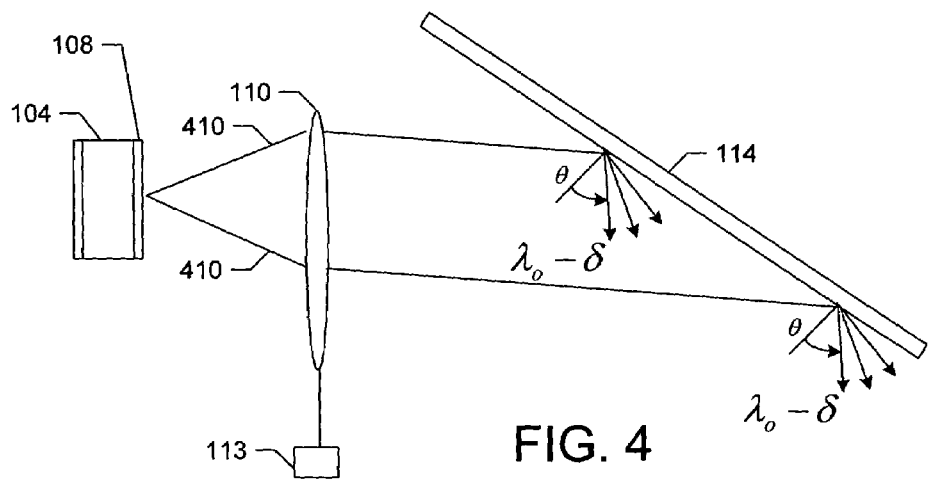
FIG. 4 is a diagram showing the lens of FIG. 1 is a third position.

For example, as shown in FIGS. 2-4, varying positions of the first lens 110 along x or y-axes (where the z-axis is the optical axis and the x and y-axes are mutually orthogonal thereto) results in a desired wavelength being reflected at angle θ and being normally incident on the mirror. FIG. 2 represents the position of the first lens 110 before the optical components have shifted positions. The rays of optical energy, two of which are shown at reference numeral 202, emitted by the gain chip 104 and are collimated by the first lens 110 into parallel rays of optical energy, two of which are shown at reference numeral 204. As each ray of collimated optical energy 204 strikes the grating 114, each ray is split into constituent wavelengths of $\lambda_o$, $\lambda_o-\delta$ and $\lambda_o+\delta$. In one particular example, $\lambda_o$, $\lambda_o-\delta$ could be wavelengths corresponding to frequency spacings of 25, 50 and 100 GHz, respectively. Because FIG. 2 represents a situation in which no optical components have shifted, the wavelength of $\lambda_o$ is reflected from the grating at the angle θ and this wavelength is the only wavelength normally incident on the mirror 118.

As shown in FIG. 3, movement of the first lens 110 downward, due to the actuator 113, causes rays of optical energy 306 from the gain chip 104 to be collimated by the first lens 110 into rays 308 that impact the grating 114 at a less acute angle (i.e., at an angle that is more normal to the grating 114) than the rays 204 of FIG. 2. Due to Snell's Law, the wavelength of $\lambda_o$ always reflects from the grating 114 at an angle that is equal to its angle of incidence. Accordingly, the shift of the lens 110 causes the wavelength $\lambda_o+\delta$ to be reflected at the angle θ.

Conversely, as shown in FIG. 4, movement of the first lens 110 upward, due to the actuator 113, causes rays of optical energy 410 from the gain chip to be collimated by the first lens 110 into rays 162 that impact the grating 114 at a more acute angle (i.e., at an angle that is less normal to the grating 114) than the rays 204 of FIG. 2. Again, due to Snell's Law, $\lambda_o$ is reflected at an angle equal to its angle of incidence, thereby causing the wavelength of $\lambda_o-\delta$ to be reflected at the angle θ.

As shown in FIGS. 2-4, it is possible to move the first lens 110 via the actuator 113 to change the wavelength that is reflected at the angle θ, which is normal to the mirror 116. For example, if the alignment in the optical cavity between the gain chip 104 and the mirror 116 were to change and thereby cause the wavelength of $\lambda_o+\delta$ to be reflected at the angle θ, it is possible to move the first lens 110 upward to change the angle of incidence and to cause the wavelength of $\lambda_o$ to be reflected from the grating at the angle θ. Additionally, it is possible to move the first lens 110 to select one of a number of wavelengths for lasing. For example, if the etalon 116 (FIG. 1) were designed to have free spectral ranges of 25, 50, and 100 GHz, the first lens 110 could be moved to select any one of the free spectral ranges for lasing by steering the desired free spectral range to reflect from the grating 114 at the angle θ. Accordingly, the movement of the first lens 110 position, which may be linear movement, allows the system 100 to be wavelength tuned by beam-steering optical energy from the gain chip 104, without the need to change the rotational position of the grating 114.

The EO crystal 124, which changes the phase of the optical beam of energy passing through as the voltage applied thereto changes, is used to maintain optimum path length control of the external cavity laser. As the gain chip ages, the current required to maintain optical output power increases and hence causes phase variations to the optical beam emanating from the gain chip. The EO crystal 124 can control the phase and hence compensate for aging of the gain chip. In addition, the actuator and mirror can react to external forces, the EO crystal phase shift compensates for the movement of the lens and maintain the external cavity path length constant. The actuator 113 and EO crystal 124 are designed such that the EO crystal 124 can fully compensate for the movement of the actuator 113 in response to external force(s).

Figure 5:
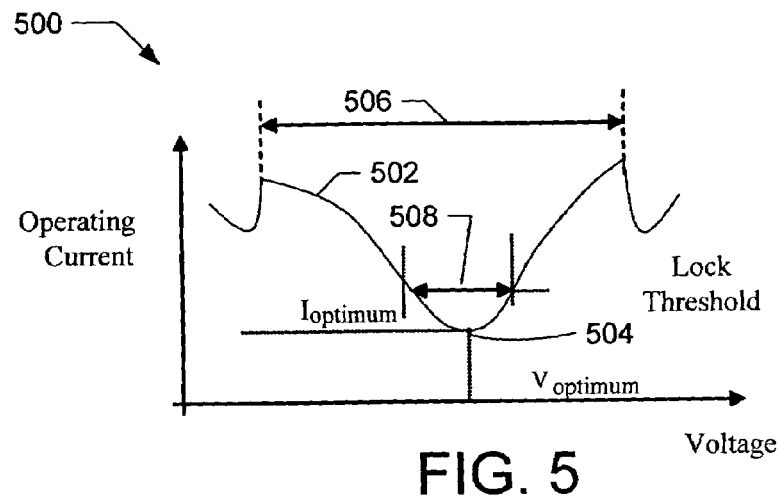
FIG. 5 is a diagram representing an example operating current versus voltage response of the optical transmitter of FIG. 1.

As shown in FIG. 5, a plot 500 of operating current 502 against EO voltage includes a point on the plot representing the minimal operating current is designated with reference numeral 504. At the point 504, the operating current is at a minimum and, therefore, the gain chip 104 is operating at its optimal efficiency. In this example, the minimum operating current is determined by taking one or more derivatives of the operating current 502 with respect to EO voltage. The minimum point 504 is a point having a second derivative value of zero that is bounded by plot portions having negative and positive first derivatives. The range denoted by reference numeral 506 is the range over which the search for the minimum point 504 is carried out and the range denoted by reference numeral 508 is a range that may be considered to be a lock threshold that is sufficiently close to the minimum point 504.

Figure 6:
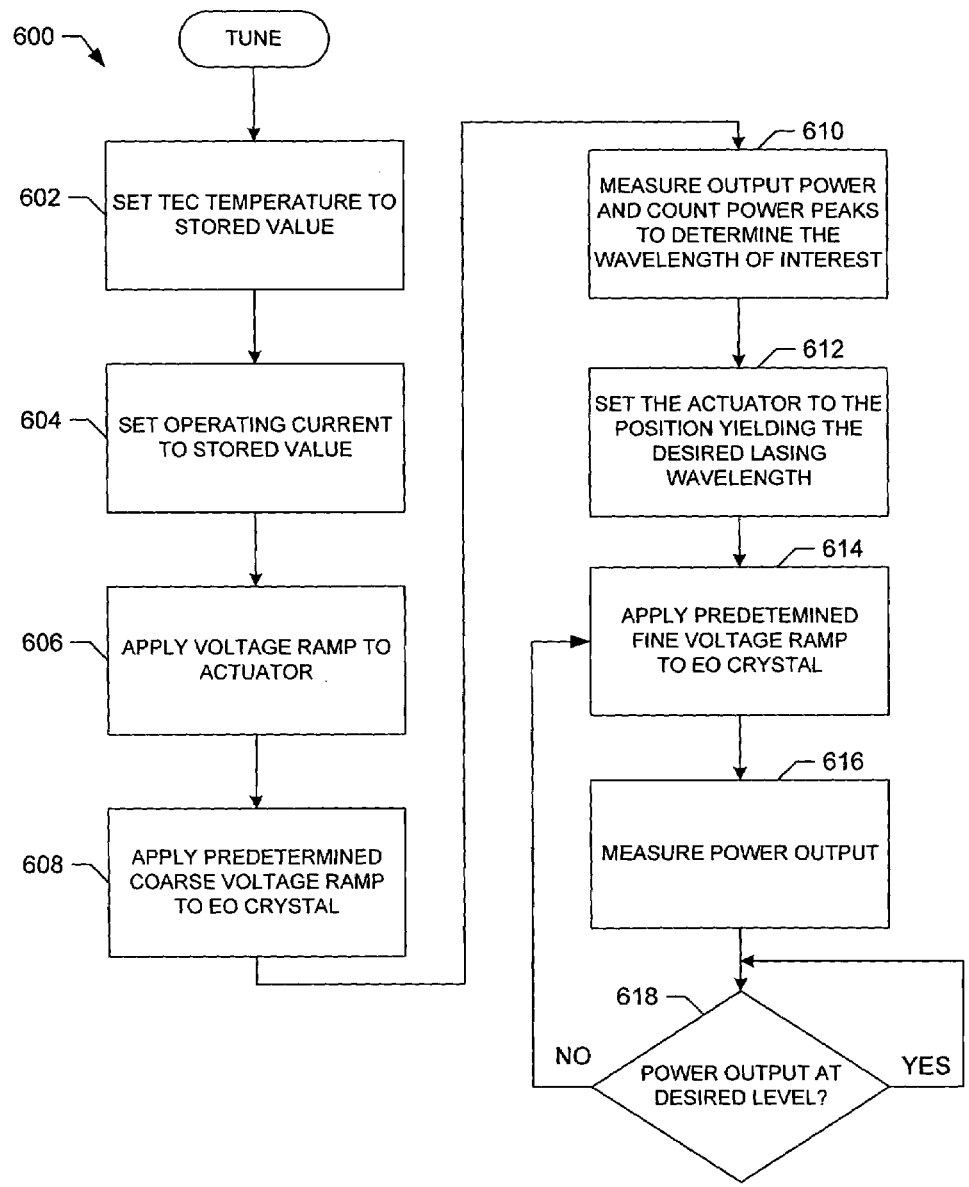
FIG. 6 is an example tune routine executed by the processing unit of FIG. 1.

Turning now to FIG. 6, a tune routine 600, which maybe stored in memory 131 and executed by the processing unit 130, is represented in block diagram format. Upon power-up, the processing unit 130 sets the substrate 102, via the TEC 129, to a stored temperature value (block 602). After the TEC temperature is set, the operating current associated with the gain chip 104 is set to a stored value (block 604).

After the operating current is set (block 604), the processing unit 130 and the voltage source 132 cooperate to apply a voltage ramp to the actuator 113 (block 606). The voltage ramp varies the position of the first lens 110, thereby steering the optical energy from the gain chip 104 as it passes to the grating 114. The variation in the first lens 110 position changes the wavelength and the optical energy that is coupled to the back facet detector 135 and front facet detector 134.

Figure 7:
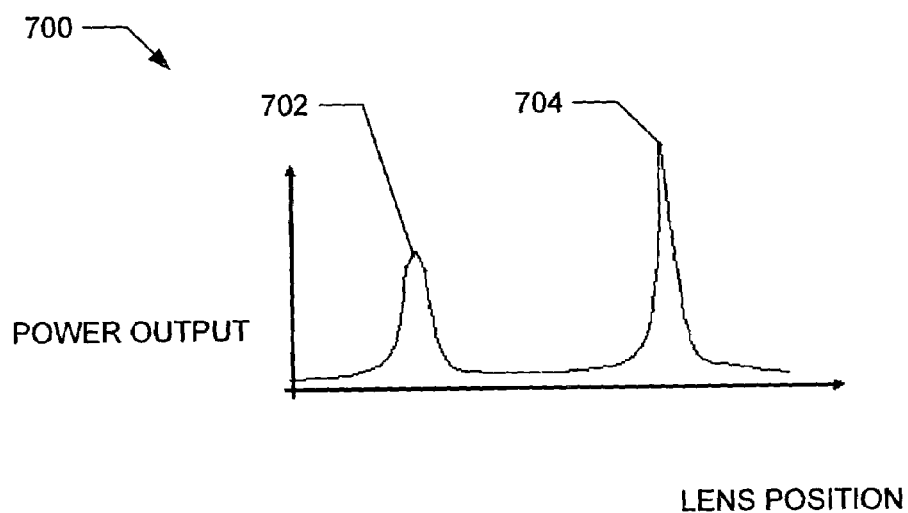
FIG. 7 is a diagram representing an example power output versus lens position response of the optical transmitter of FIG. 1.

As the voltage ramp is applied to the actuator 113, the processing unit 130 measures via the front facet detector 134 or the back facet detector 135 the output power of the gain chip 104 as a function of the position of the first lens 110 (block 610). As the processing unit 130 monitors the output power of the gain chip 104, the processing unit 130 counts the number of output power peaks that are detected (block 610). For example, as shown in FIG. 7, a plot 700 shows power output versus first lens 110 position. Reference numerals 702 and 704 represent peaks in the output power that may be due to the resonant properties of the optical cavity. For example, the first peak 702 may be located at a lens position corresponding to a reflected wavelength at an ITU specified wavelength. The second peak 704 may be located at a lens position corresponding to a reflected wavelength with a frequency separation of 100 GHz with respect to the first peak 702. Power peaks at these lens positions may be due to the etalon 116 having free spectral ranges of 50 or 100 GHz, respectively, and the difference in the magnitudes between the first and second peaks 702, 704 is due to the path length not being optimized for all the selected wavelengths.

The processing unit 130 is informed, a priori, of the etalon 116 characteristics and the EO crystal voltage ramp to keep cavity length approximately constant as the actuator 113 moves. Accordingly, the processing unit 130 is able to determine, based on an analysis of the peaks in the power output plot 700, the wavelengths that correspond to the two lens positions that yield the peaks 702, 704. Accordingly, starting with a first lens position of zero and ramping the voltage on the actuator 113 to move the first lens 110 to its farthest position, the processing unit 130 determines the lens positions at which peaks occur, merely by counting the peaks experienced by the front facet detector 134 or the back facet detector 135 as the voltage to the actuator 113 is ramped.

After the processing unit 130 determines power output as a function of the actuator voltage (block 606), the processing unit 130 sets the actuator 113 to the position yielding the desired lasing wavelength, which is one of the peaks in the power output plot 702 (block 612). When the actuator 113 is set to the desired position, the first lens 110 is in a position that beam-steers the desired wavelength to impact the grating 114 at an angle that causes the desired wavelength to be reflected from the grating at the desired angle. The processing unit 130 measures the power output as determined by the front facet detector 134 or the back facet detector 135 (block 616) and monitors the power output to keep the power output at a desired level (block 618). The processing unit 130 maintains operation at block 618 as long as the power output is at the desired level. If the power output drops below or rises above the desired level, the processing unit will again apply the voltage ramp to the actuator 113 (block 606).

Figure 8:
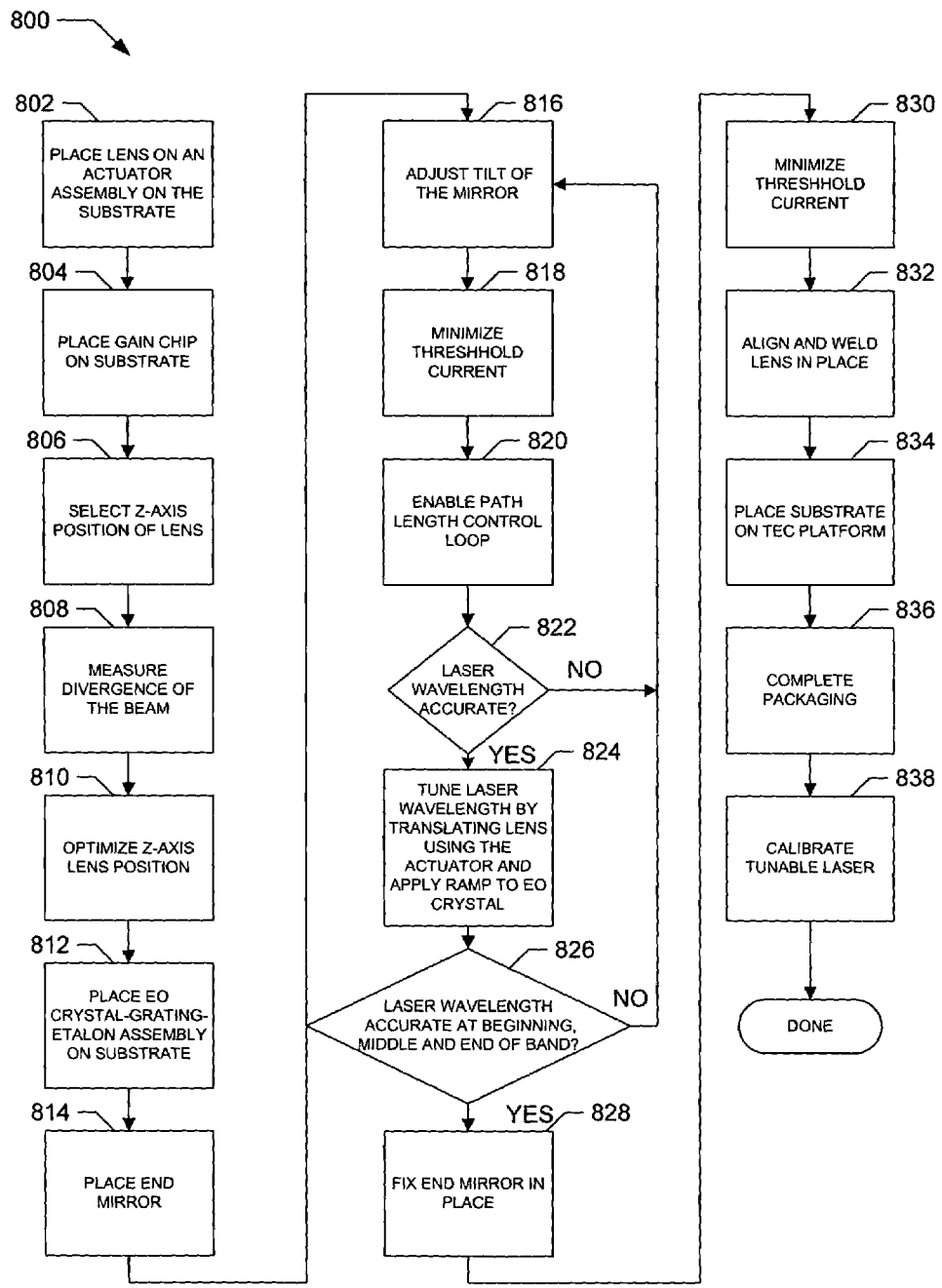
FIG. 8 is a diagram of an example process by which the optical transmitter of FIG. 1 may be manufactured.

Turning now to FIG. 8, a process by which the optical transmitter 100 may be fabricated is shown at reference numeral 800. The process begins by placing a lens (e.g., the first lens 110) on an actuator (e.g., the actuator 113) and placing both the actuator and its associated lens on a substrate (e.g., the substrate 102) (block 802). The gain chip (e.g., the gain chip 104) is then placed on the substrate 102. As the gain chip is placed on the substrate using a pick and place machine, the x-axis position of the gain chip is controlled tightly. The z-axis position of the lens 110 is then selected using the actuator 113 to move the lens 110 (block 806). The divergence of the beam is then measured (block 808). The z-axis position of the lens 110 is then optimized using the actuator 113 to minimize the divergence and to collimate the light beam from the gain chip 104 (block 810).

The EO 124 and the etalon 116 are then placed on the substrate 102 between the lens 110, which, as discussed above, is disposed on the actuator 113, and the mirror 118, which has tilt control about its y-axis (blocks 812 and 814). The tilt of the mirror 118 is adjusted to start the external cavity lasing at any ITU channel and to maximize the output power of the laser (block 816). The threshold current of the gain chip 104 is then minimized using the actuator 113 to vary the y and z-axis positions of the lens 110 (block 818). The path length control loop, which varies the voltage bias on the EO 124 to adjust path length, is then enabled (block 820).

Figure 9:
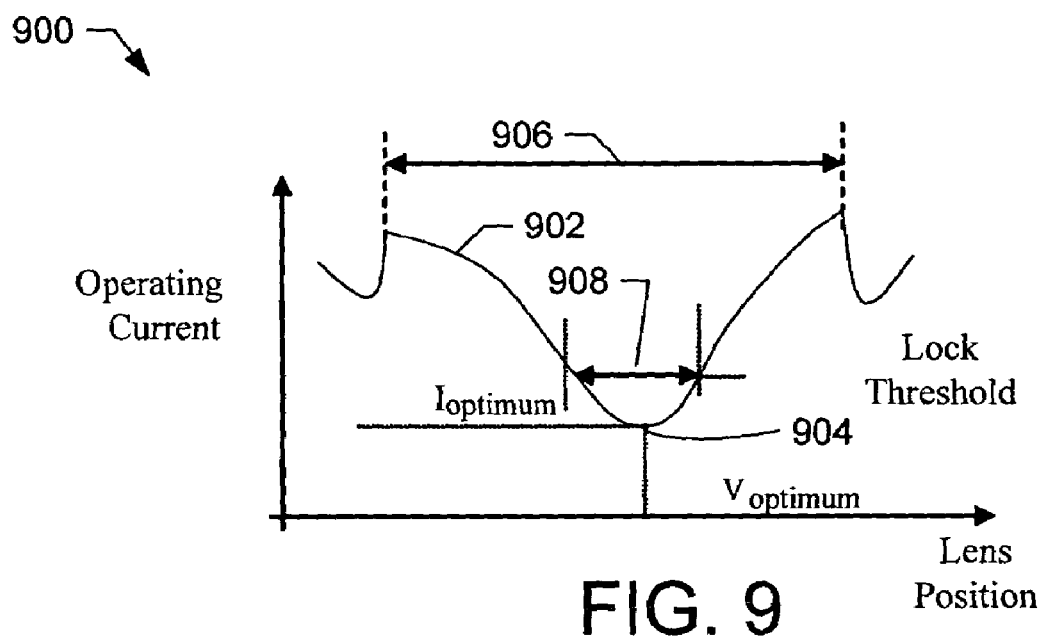
FIG. 9 is a diagram representing an example operating current versus z-axis position of the lens of FIG. 1.

Referring back to block 810, divergence is minimized when operating current is minimized. As shown in FIG. 9, a plot 900 of operating current 902 against z-axis lens position includes a point on the plot representing the minimal operating current is designated with reference numeral 904. At the point 904, the operating current is at a minimum and, therefore, divergence is a minimum. In this example, the minimum operating current is determined by taking one or more derivatives of the operating current 902 with respect to the z-axis position. The minimum point 904 is a point having a second derivative value of zero that is bounded by plot portions having negative and positive first derivatives. The range denoted by reference numeral 906 is the range over which the search for the minimum point 904 is carried out and the range denoted by reference numeral 908 is a range that may be considered to be a lock threshold that is sufficiently close to the minimum point 904.

If the laser wavelength is accurate to within, for example, 1 GHz of the ITU wavelength specification (block 822), the laser is then wavelength tuned by translating the lens 110 in, for example, the y-axis, using the actuator 113 (block 824). Alternatively, if the laser wavelength is not within 5 picometers of the ITU wavelength specification, the tilt of the mirror 118 is changed (block 816), the threshold current is minimized by changing the lens position (block 818) and the path length control loop is enabled (block 820).

The laser wavelength is then tested to determine if it is accurate to within 5 picometers at the beginning, middle, and end of, for example, the C and/or L bands (block 826). Alternatively, any other band in the optical range may be selected for use. If the laser wavelength is not accurate to within 5 picometers, the tilt of the mirror 118 is adjusted (block 816) and the threshold current is minimized by varying the lens position (block 818) and the path length control loop is enabled (block 820). When the laser wavelength is accurate to within 5 picometers at the beginning, middle and end of the C/L band (block 326), the mirror 118 is fixed in place (block 828) and the threshold current is minimized by changing the position of the lens 110 in the y and z-axes via the actuator 113 to compensate for post-fix movement of the mirror 118 (block 830).

After the lens is fixed in place (block 828) and the threshold current is minimized (block 830), the second lens (e.g., the lens 112) is aligned to couple light from the gain chip 104 to the coupling 122, which includes the beam splitter 136 and the front facet detector 134. The second lens is then welded in place on the substrate 102 (block 832). After the lens 112 or system of lenses has been fixed in place, the substrate 102 is placed on the TEC 129 (block 834) and the hermetic sealing of the package including the components of FIG. 1 is completed (block 836).

After packaging is complete (block 836), the tunable laser is calibrated (block 838). Calibration includes, but is not limited to, determining control circuit set points for wavelength control, which is controlled by the position of the lens 110 on the actuator 113, and path length control. Calibration may also include populating a look up table of lens positions and EO bias voltages as functions of lasing wavelengths.

Although certain methods and apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A method of assembling an external cavity optical transmitter, the method comprising:
   placing a lens mounted on an actuator on a substrate;
   placing a gain chip on the substrate proximate the lens;
   optimizing the placement of the lens along an optical axis, based on divergence of optical energy coupled through the lens;
   placing a grating assembly on the substrate in a fixed manner;
   placing a mirror on the substrate in a fixed manner to form a resonant cavity between the mirror and the gain chip;
   enabling the gain chip to emit optical energy; and
   changing a positional setting of the actuator to cause the lens to be translated to a position that yields a desired wavelength of operation.

2. A method as defined by claim 1, wherein changing the positional setting of the actuator comprises sending control signals to the actuator to cause the lens to be displaced in a plane perpendicular to the optical axis.

3. A method as defined by claim 1, further including placing an electro-optical crystal on the substrate.

4. A method as defined by claim 1, further including adjusting a tilt position of the mirror to affect a wavelength of operation.

5. A method as defined by claim 1, further including testing a wavelength of operation at various locations in an operating frequency band.

* * * * *